(12) United States Patent
Stender et al.

(10) Patent No.: US 11,111,435 B2
(45) Date of Patent: Sep. 7, 2021

(54) TUNGSTEN CHEMICAL MECHANICAL PLANARIZATION (CMP) WITH LOW DISHING AND LOW EROSION TOPOGRAPHY

(71) Applicant: Versum Materials US, LLC, Tempe, AZ (US)

(72) Inventors: Matthias Stender, Phoenix, AZ (US); Agnes Derecskei, Fountain Hills, AZ (US); Bradley J. Brennan, Omaha, NE (US)

(73) Assignee: VERSUM MATERIALS US, LLC, Tempe, AZ (US)

(*) Notice: Subject to any disclaimer, the term of this patent is extended or adjusted under 35 U.S.C. 154(b) by 0 days.

(21) Appl. No.: 16/520,671

(22) Filed: Jul. 24, 2019

(65) Prior Publication Data

US 2020/0040256 A1 Feb. 6, 2020

Related U.S. Application Data

(60) Provisional application No. 62/712,901, filed on Jul. 31, 2018, provisional application No. 62/771,832, filed on Nov. 27, 2018.

(51) Int. Cl.
*C09K 13/06* (2006.01)
*H01L 21/321* (2006.01)
*C09G 1/02* (2006.01)
*C09K 13/00* (2006.01)

(52) U.S. Cl.
CPC ............. *C09K 13/06* (2013.01); *C09G 1/02* (2013.01); *C09K 13/00* (2013.01); *H01L 21/3212* (2013.01)

(58) Field of Classification Search
None
See application file for complete search history.

(56) References Cited

U.S. PATENT DOCUMENTS

| 4,789,648 | A | | 12/1988 | Chow et al. |
| 6,099,604 | A | * | 8/2000 | Sandhu ............... C09G 1/02 106/3 |
| 6,436,834 | B1 | | 8/2002 | Lee et al. |
| 10,479,879 | B2 | | 11/2019 | Someya |
| 2003/0181345 | A1 | | 11/2003 | Bian |

(Continued)

FOREIGN PATENT DOCUMENTS

| CN | 101275057 A | 10/2008 |
| CN | 102888208 A | 1/2013 |

(Continued)

OTHER PUBLICATIONS

Yagishita, A., et al., "High Performance Damascene Metal Gate MOSFET's for 0.1 um Regime." IEEE: Transactions on Electronic Devices. vol. 47, No. 5, May 2000, pp. 1028-1034.

(Continued)

*Primary Examiner* — Allan W. Olsen
(74) *Attorney, Agent, or Firm* — Lina Yang (57) ABSTRACT

This invention pertains to compositions, methods and systems that can be used in chemical mechanical planarization (CMP) of a tungsten containing semiconductor device. CMP slurries comprising bicyclic amidine additives provide low dishing and low erosion topography.

7 Claims, 3 Drawing Sheets

(56) References Cited

U.S. PATENT DOCUMENTS

| | | | |
|---|---|---|---|
| 2005/0066585 A1* | 3/2005 | Bian | H01L 21/3212 51/307 |
| 2006/0068589 A1 | 3/2006 | Bian | |
| 2006/0080896 A1 | 4/2006 | Takami | |
| 2007/0131899 A1 | 6/2007 | Bian | |
| 2008/0276543 A1 | 11/2008 | Thomas | |
| 2010/0193728 A1 | 8/2010 | Chang et al. | |
| 2010/0216309 A1 | 8/2010 | Minami et al. | |
| 2011/0318928 A1 | 12/2011 | Bian | |
| 2015/0267112 A1* | 9/2015 | Dory | C23F 1/00 257/741 |
| 2016/0237315 A1 | 8/2016 | Stender et al. | |

FOREIGN PATENT DOCUMENTS

| | | |
|---|---|---|
| EP | 1211024 A2 | 6/2002 |
| EP | 1520893 A1 | 4/2005 |
| JP | 2002249762 A2 | 9/2002 |
| JP | 2014125628 A2 | 7/2014 |
| JP | 2017039884 A | 2/2017 |
| KR | 101109002 B1 | 2/2012 |
| KR | 20160099498 A | 8/2016 |
| TW | 201617432 A | 5/2016 |
| WO | 09905706 A1 | 2/1999 |
| WO | 2015012778 A2 | 1/2015 |

OTHER PUBLICATIONS

Intellectual Property Office of Singapore (IPOS), Search Report, Appln. No. 102019069825 (filed Jul. 30, 2019), dated Aug. 25, 2020.

* cited by examiner

TUNGSTEN CHEMICAL MECHANICAL PLANARIZATION (CMP) WITH LOW DISHING AND LOW EROSION TOPOGRAPHY

CROSS REFERENCE TO RELATED APPLICATION(S)

This application claims the benefit of U.S. Provisional Patent Application No. 62/712,901 filed Jul. 31, 2018 and U.S. Provisional Patent Application No. 62/771,832 filed Nov. 27, 2018, which are incorporated herein by reference as if fully set forth.

BACKGROUND

This invention pertains to slurries (also referred to as compositions or formulations), systems, and methods used for Chemical Mechanical Polishing or Planarization (CMP) of semiconductor devices, particularly for materials containing tungsten. CMP is a process using a combination of chemical and mechanical forces to smooth or planarize surfaces. As such, it is a hybrid of chemical etching and abrasive polishing.

Integrated circuits are interconnected through the use of well-known multilevel interconnections. Interconnection structures normally have a first layer of metallization, an interconnection layer, a second level of metallization, and typically third and subsequent levels of metallization. Interlevel dielectric materials such as silicon dioxide and sometimes low-k materials are used to electrically isolate the different levels of metallization in a silicon substrate or well. The electrical connections between different interconnection levels are made through the use of metallized vias and in particular tungsten vias. U.S. Pat. No. 4,789,648 describes a method for preparing multiple metallized layers and metallized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to the dielectric material.

In one semiconductor manufacturing process, metallized vias or contacts are formed by a blanket tungsten deposition followed by a CMP step. In a typical process, via holes are etched through the interlevel dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess tungsten is removed by CMP to form metal vias.

In another semiconductor manufacturing process, tungsten is used as a gate electrode material in the transistor because of its superior electrical characteristics over polysilicon which has been traditionally used as a gate electrode material, as taught by A. Yagishita et al, IEEE TRANSACTIONS ON ELECTRON DEVICES, VOL. 47, NO. 5, May 2000.

In a typical CMP process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a polishing "slurry", a polishing "composition" or a polishing "formulation", is deposited onto the pad during polishing, where rotation and/or movement of the pad relative to the wafer brings said slurry into the space between the polishing pad and the substrate surface. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed. Removal of tungsten in the CMP is believed to be due to synergy between mechanical abrasion and tungsten oxidation followed by dissolution.

One of the commonly encountered problems in CMP, particularly in metal applications such as tungsten, is dishing of tungsten lines and erosion of arrays of metal lines. Dishing and erosion are critical CMP parameters that define the planarity of the polished wafers and are discussed in depth below. Tungsten CMP slurries must be formulated such that the dishing and erosion can be minimized in order to meet certain design targets critical for a functioning device.

Dishing of lines typically increases for wider lines. Typically, dishing of 100 micron wide lines at 50% pattern density is considered a representative structure for measuring the effectiveness of slurry in reducing dishing during CMP. Erosion of arrays typically increases with an increase in pattern density. Erosion of a 9 micron metal array with 1 micron spacing (9×1 micron array, 90 percent pattern density) is typically used as the representative structure for measuring the capability of slurry to reduce erosion. In a typical tungsten CMP process, it is desirable that the tungsten dishing for 100 micron lines is less than 2000 Angstroms and the erosion of the 9×1 micron array is less than 1500 Angstroms.

There is an unmet need in the art for novel CMP slurries, particularly slurries for polishing tungsten, that can reduce dishing and erosion while maintaining a desirable removal rate in polishing.

SUMMARY

The present invention relates to CMP slurries (compositions or formulations), specifically systems and methods of using the CMP slurries to reduce erosion and dishing while maintaining a desirable removal rate in polishing a semiconductor device or substrate. More specifically, the present invention relates to CMP slurries, specifically systems and methods of using the CMP slurries to reduce dishing and erosion while maintaining a desirable removal rate in a polishing semiconductor device or substrate containing tungsten.

In addition, several specific aspects of the present invention are outlined below.

Aspect 1: A chemical mechanical planarization (CMP) composition comprising:

an abrasive;

an oxidizing agent;

an amidine compound, or hydrolyzed derivative thereof, comprising a carbon atom bonded to a first nitrogen atom by a double bond and a second nitrogen atom by a single bond, the amidine compound having a structure of:

wherein

R$_1$, R$_2$, R$_3$ and R$_4$ are independently selected from the group consisting of: oxygen; nitrogen; hydrogen; carbon; a heterocyclic carbon ring; a saturated or unsaturated cyclic group which may be substituted or unsubstituted; a linear or branched C$_1$ through C$_{20}$ alkyl group, which may be saturated or unsaturated, and which may include saturated or unsaturated cyclic groups; and a saturated or unsaturated ring structure formed from two or three of R$_1$, R$_2$, R$_3$, R$_4$, the ring optionally being substituted; and a solvent.

Aspect 2: The CMP composition of Aspect 1, wherein the amidine compound comprises at least one pKa greater than 9.

Aspect 3: The CMP composition of any of Aspects 1-2, wherein the CMP composition comprises a pH ranging from 1 through 7.

Aspect 4: The CMP composition of any of Aspects 1-3, wherein the CMP composition comprises a pH ranging from 2 through 5.

Aspect 5: The CMP composition of any of Aspects 1-4, wherein the abrasive comprises at least one of: colloidal silica; fumed silica; alumina; titania; ceria; zirconia; surface modified particles selected from the group consisting of activator-containing particles, composite particles, lattice doped and inorganic oxide particles; and cationic or anionic charge-modified particles.

Aspect 6: The CMP composition of any of Aspects 1-5, wherein the oxidizing agent comprises at least one of: hydrogen peroxide; urea peroxide; peroxyformic acid; peracetic acid; propaneperoxoic acid; substituted or unsubstituted butaneperoxoic acid; hydroperoxy-acetaldehyde; potassium periodate; ammonium peroxymonosulfate; and ferric nitrite; KClO$_4$; KBrO$_4$; and KMnO$_4$.

Aspect 7: The CMP composition of any of Aspects 1-6, wherein the amidine compound comprises a heterocyclic carbon ring.

Aspect 8: The CMP composition of any of Aspects 1-7, wherein the amidine compound is a bicyclic amidine compound or hydrolyzed derivative.

Aspect 9: The CMP composition of Aspect 8, wherein the amidine compound has a positive charge distribution.

Aspect 10: The CMP composition of Aspect 8, wherein the bicyclic amidine compound comprises at least one of: 2-phenyl-2-imidazoline; 1,8-Diazabicyclo[5.4.0]undec-7-ene; 1,8-Diazabicyclo[5.4.0]undec-7-ene solution; 1,5-Diazabicyclo[4.3.0]non-5-ene; 1,5,7-Triazabicyclo[4.4.0]dec-5-ene; 7-Methyl-1,5,7-triazabicyclo[4.4.0]dec-5-ene; 3,3,6,9,9-Pentamethyl-2,10-diazabicyclo[4.4.0]dec-1-ene; and 1,5-Diazabicyclo[4.3.0]non-5-ene.

Aspect 11: The CMP composition of any of Aspects 1-10, wherein the amidine compound is 1,8-Diazabicyclo[5.4.0]undec-7-ene, or a hydrolyzed derivative thereof.

Aspect 12: The CMP composition of any of Aspects 1-11, wherein the amidine compound is 2-phenyl-2-imidazoline or a hydrolyzed derivative thereof.

Aspect 13: The CMP composition of any of Aspects 1-12, wherein the solvent is selected from the group consisting of: water, alcohols, ethers, ketones, glycols, organic acids, and combinations thereof.

Aspect 14: The CMP composition in any one of aspects 1-13, wherein the amidine compound is a hydrolyzed derivative of a bicyclic amidine compound having a zeta potential greater than 8 millivolts at a pH of 2.3.

Aspect 15: The CMP composition of any of Aspects 1-14, further comprising an activator selected from the group consisting of: a soluble activator compound; a particle with a surface modified with activator compound; a particle with activator included in both the particle core and the surface; and a core-shell composite particle comprising activator exposed on the shell surface.

Aspect 16: The CMP composition of Aspect 15, wherein the activator is a soluble activator compound comprising at least one of: ammonium iron (III) oxalate trihydrate; iron (III) citrate tribasic monohydrate; iron (III) acetylacetonate; iron(III) nitrate and hydrated salts thereof; and ethylenediamine tetraacetic acid iron (III) sodium salt hydrate.

Aspect 17: The CMP composition of any of Aspects 1-16, further comprising a stabilizer comprising at least one of: adipic acid; phthalic acid; citric acid; malonic acid; oxalic acid, orthophthalic acid; phosphoric acid; substituted or unsubstituted phosphonic acid; phosphonate compounds; and nitriles.

Aspect 18: The CMP composition of any of Aspects 1-17, further comprising a dishing reducer comprising at least one of: sarcosinate; hydrocarbon substituted sarcosinate; amino acids, organic polymers and copolymers comprising ethylene oxide repeating units; ethoxylated surfactants; nitrogen containing heterocycles without nitrogen-hydrogen bonds, sulfide, oxazolidine or mixtures of functional groups in one compound; nitrogen containing compounds having three or more carbon atoms that form alkylammonium ions; amino alkyls having three or more carbon atoms; polymeric corrosion inhibitors comprising repeating group of at least one nitrogen-containing heterocyclic ring or a tertiary or quaternary nitrogen atom; polycationic amine compounds; cyclodextrin compounds; polyethyleneimine compounds; glycolic acid; chitosan; sugar alcohols; polysaccharides; alginate compounds; phosphonium compounds and sulfonic acid polymers.

Aspect 19: The CMP composition of any of Aspects 1-18, comprising silica, hydrogen peroxide, ferric nitrate, glycine, malonic acid, and 1,8-Diazabicyclo[5.4.0]undec-7-ene or a hydrolyzed derivative thereof.

Aspect 20: The CMP composition of Aspect 19, wherein the CMP composition comprises from 0.0001% to 0.5 percent by weight of 1,8-Diazabicyclo[5.4.0]undec-7-ene or a hydrolyzed derivative thereof.

Aspect 21: A system for chemical mechanical planarization of a semiconductor substrate having at least one surface comprising tungsten, the system comprising:

a polishing pad;

the polishing composition of Aspect 1;

and an applicator operationally configured to apply the polishing composition to the polishing pad; and a carrier that is operationally configured to bring the at least one surface of comprising tungsten in contact with the polishing pad.

Aspect 22: A method for chemical mechanical planarization (CMP) of a tungsten-containing surface of a semiconductor device, comprising the steps of:

a) applying the composition of Aspect 1 to a polishing pad;

b) after performing step (a), polishing the tungsten-containing surface with the polishing pad produce a polished tungsten-containing surface.

Aspect 23: The method of Aspect 22, further comprising:

c) continuing to perform step (b) until the tungsten-containing surface comprises a dishing topography of less than 1000 Angstroms and an erosion topography of less than 1000 Angstroms.

The at least one amidine compound in the polishing composition can be part of a heterocyclic carbon ring, part of a bicyclic carbon compound, or is a bicyclic amidine compound. The bicyclic amidine compound can have a positive charge distribution. The bicyclic amidine compound includes but is not limited to 1,8-Diazabicyclo[5.4.0]undec-7-ene, 1,8-Diazabicyclo[5.4.0]undec-7-ene solution, 1,5-Diazabicyclo[4.3.0]non-5-ene, 1,5,7-Triazabicyclo[4.4.0]dec-5-ene, 7-Methyl-1,5,7-triazabicyclo[4.4.0]dec-5-ene, 3,3,6,9,9-Pentamethyl-2,10-diazabicyclo[4.4.0]dec-1-ene, and 1,5-Diazabicyclo[4.3.0]non-5-ene. 1,8-Diazabicyclo[5.4.0]undec-7-ene (DBU) is preferred.

In some other embodiments the at least one amidine compounds could include a hydrolyzed form of amidine compounds.

An example of a hydrolysis reaction of a bicyclic amidine compound (1,8-Diazabicyclo[5.4.0]undec-7-ene) is shown in Equation 1 below:

Equation 1

The CMP composition may further comprise an activator selected from the group consisting of i) a soluble activator compound in the slurry (ii) a particle with a surface modified with activator compound (iii) particles with activator included in the both the particle core and the surface (iv) core-shell composite particles comprising activator exposed on the surface. A soluble iron compound is a preferred activator.

The CMP composition may further comprise a stabilizer selected from the group consisting of: an organic acid selected from the group consisting of adipic acid, phthalic acid, citric acid, malonic acid and orthophthalic acid; phosphoric acid; substituted or unsubstituted phosphonic acid; phosphonate compound; nitrile; a ligand which can bind the activator material and thus reduce reactions that degrade the oxidizing agent; and combinations thereof. Malonic acid is a preferred stabilizer.

The CMP composition may further comprise a dishing reducing additive or a dishing reducer selected from the group consisting of sarcosinate and related carboxylic compounds; hydrocarbon substituted sarcosinate; amino acids; organic polymers and copolymers having molecules containing ethylene oxide repeating units, such as polyethylene oxide (PEO); ethoxylated surfactants; nitrogen containing heterocycles without nitrogen-hydrogen bonds, sulfide, oxazolidine or mixture of functional groups in one compound; nitrogen containing compounds having three or more carbon atoms that form alkylammonium ions; amino alkyls having three or more carbon atoms; polymeric corrosion inhibitor comprising a repeating group of at least one nitrogen-containing heterocyclic ring or a tertiary or quaternary nitrogen atom; polycationic amine compound; cyclodextrin compound; polyethyleneimine compound; glycolic acid; chitosan; sugar alcohols; polysaccharides; alginate compound; phosphonium compound; sulfonic acid polymer. Glycine is a preferred dishing reducing additive.

The CMP composition may optionally further comprise surfactants, dispersion agents, chelators, film-forming anti-corrosion agents, pH adjusting agents, biocide, and a polish enhancement agent.

In another embodiment, the CMP composition to polish tungsten comprises abrasive particles, at least one oxidizing agent, an activator, and at least one bicyclic amidine compound with the pH of the slurry being between 1 and 14, more preferably between 1 and 7, and most preferably between 2 and 5.

In another embodiment, the CMP composition to polish a tungsten surface comprises abrasive particles, hydrogen peroxide, a soluble iron compound, an additive to stabilize hydrogen peroxide in the presence of the iron compound, and at least one bicyclic amidine compound with the pH of the slurry being between 1 and 14, more preferably between 1 and 7, and most preferably between 2 and 5.

In another embodiment, the CMP composition to polish a tungsten surface comprises abrasive particles, at least one oxidizing agent, an activator, and a bicyclic amidine compound wherein the bicyclic amidine compound is 1,8-Diazabicyclo[5.4.0]undec-7-ene and the pH of the slurry is between 1 and 14, more preferably between 1 and 7, and most preferably between 2 and 5.

In yet another embodiment, the CMP composition to polish a tungsten surface comprises silica particles, hydrogen peroxide, ferric nitrate, glycine, malonic acid, and a bicyclic amidine compound wherein the bicyclic amidine compound is 1,8-Diazabicyclo[5.4.0]undec-7-ene and the pH of the slurry is between 1 and 14, more preferably between 1 and 7, and most preferably between 2 and 5.

BRIEF DESCRIPTION OF THE DRAWINGS

The present invention will hereinafter be described in conjunction with the appended figures wherein like numerals denote like elements.

DETAILED DESCRIPTION

The formation of conducting metal features during semiconductor device wafer fabrication comprises the steps of patterning the wafer, etching line trenches or vias in the dielectric materials that comprise the wafer, filling those vias or line trenches with conducting metals, and then performing the chemical mechanical planarization (CMP) step to remove excess metal and provide a very planar surface. The CMP process uses a chemical slurry (also referred to as a formulation or composition) that is both abrasive and corrosive, in conjunction with a polishing pad, typically of a greater diameter than the wafer. The polishing pad is rotated and while the slurry is applied to the pad, the pad and wafer are pressed together. This removes material and tends to even out any irregular topography, making the wafer flat or planar.

Figure 1:
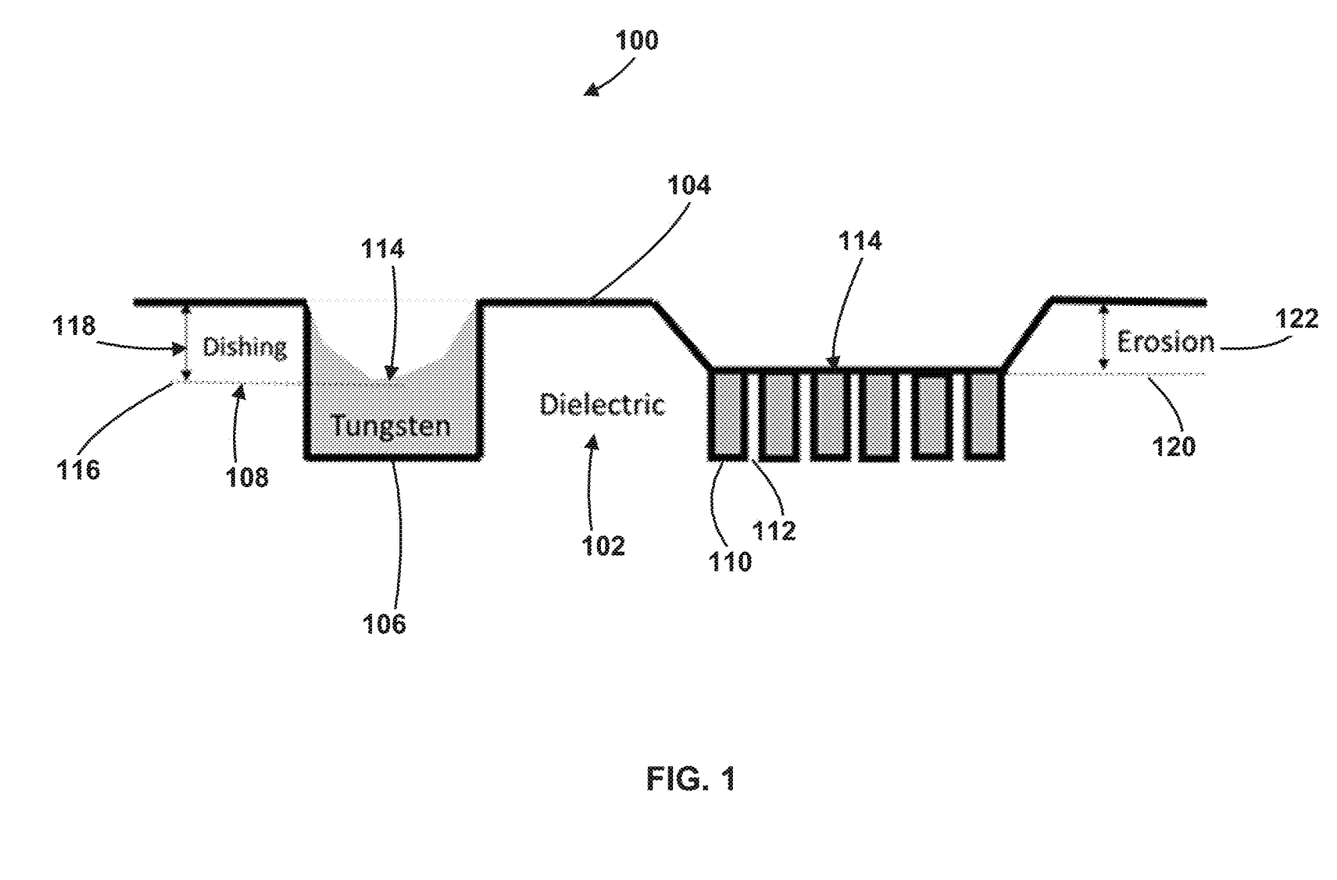
FIG. 1 shows a schematic of dishing in individual lines and erosion of an array of metal lines in a semiconductor substrate after CMP.

Critical CMP parameters that define the planarity of the polished wafers are dishing and erosion. FIG. 1 shows a representation of dishing and erosion topography observed after CMP of a polished wafer or substrate 100. The wafer or substrate comprises a dielectric material 102 having a polished surface 104. Line trenches or vias 106, 110 are etched into the dielectric material 102 separated by spacing 108, 112. Prior to the CMP process, the trenches or vias are filled with conducting metals, for example, tungsten 114.

Dishing refers to the depression in an individual line or via 116 relative to the polished surface of the substrate, also referred to as the field level 104. Dishing is quantified as the distance 118 between the field level 104 and the depth of the line depression 116. Dishing is primarily a significant issue for larger features (typically greater than 1 micron) and in low patterned density areas.

Erosion is the depression of an array of metal structures 120 compared to the field level 104. Erosion is quantified as the distance 122 between the field level 104 and the depth of the array 120. Erosion is generally more problematic for dense arrays of narrow metallic structures with feature sizes of 10 micron or less and a patterned metal density of 50 percent or more. (Elbel et al, J. Electrochem Soc., Col. 145, No. 5, May 1998 pp. 1659-1664.)

Dishing of lines typically increases for wider lines. Typically dishing of 100 micron wide lines at 50 percent pattern density is considered a representative structure for measuring capability of slurry in reducing dishing during CMP. Erosion of arrays typically increases with an increase in pattern density. Erosion of a 9 micron metal array with 1 micron spacing (9×1 micron array, 90 percent pattern density) is typically used as the representative structure for measuring the capability of slurry to reduce erosion. In a typical tungsten CMP process, it is desirable that tungsten dishing for 100 micron lines is less than 2000 Angstroms and the erosion of the 9×1 micron array is less than 1500 Angstroms.

The present invention pertains to slurries that can be used in chemical mechanical planarization (CMP) of tungsten containing semiconductor devices, substrates, or films. CMP slurries of the present invention provide the unique result of low dishing and reduced erosion of tungsten structures while providing high removal rates, excellent colloidal stability, and very low corrosion. The tungsten film or substrate may be purely tungsten or may contain tungsten alloying elements. Tungsten alloy elements include, but are not limited to, cobalt, titanium and germanium.

Formulations of this invention may be suitable for many types of dielectric materials used in patterned structures. Examples of dielectric materials include, but are not limited to, thermal oxide, Tetra Ethyl Ortho Silicate (TEOS), High Density Plasma (HDP) oxide, High Aspect Ratio Process (HARP) films, fluorinated oxide films, doped oxide films, organosilicate glass (OSG) low-K dielectric films, Spin-On Glass (SOG), polymer films, flowable Chemical Vapor Deposited (CVD), silicon nitride, silicon carbide, silicon oxy carbide, silicon oxy nitride, and silicon oxy carbide nitride.

In a preferred embodiment, the CMP slurry or formulation of this invention comprises an abrasive, an oxidizing agent, a bicyclic amidine compound, and solvent wherein the CMP slurry has a pH between 1 and 14, more preferably between 1 and 7, and most preferably between 2 and 5. In embodiments, the CMP composition optionally may further comprise other ingredients including, but not limited to, an activator, a stabilizer, a dishing reducing additive (also referred to as a dishing reducer), a surfactant, a dispersion agent, a chelator, a film-forming anticorrosion agent, a pH adjusting agent, a biocide, and a polish enhancement agent.

As used herein, the terms "a" or "an" also include plural forms such that a term such as "an activator" includes embodiments wherein more than one activators are present.

As used herein, percent compositions are given in weight percent relative to the entire CMP slurry or composition unless otherwise stated.

Abrasive

The abrasive used in the CMP slurries of the present invention include activator-containing particles (i.e., an abrasive having an activator coating) and non-activator-containing particles. The abrasive is generally in the form of an abrasive particle and typically many abrasive particles are made of one material or a combination of different materials. Preferably, a suitable abrasive particle is substantially spherical and has an effective diameter of about 10 to about 300 nanometers (nm), although individual particle size may vary. Abrasive in the form of aggregated or agglomerated particles is preferably processed further to form individual abrasive particles.

The particle size of the abrasive may be measured by any suitable technique, including, but not limited to, static light scattering, dynamic light scattering, hydrodynamic fluid fractionation, sedimentation analysis, electrical sensing zone analysis and dynamic image analysis, and disc centrifuge analysis. A preferred method for particle size and distribution measurement is dynamic light scattering. In embodiments the CMP slurry may have more than one type of abrasive and it may be advantageous to have different sizes for different types of abrasive.

Abrasives include, but are not limited to, metal oxide, a metalloid oxide, or a chemical mixture of metal oxides and metalloid oxides. Suitable metal oxide abrasives include, but are not limited to, alumina, ceria, germania, silica, spinel, titania, an oxide or nitride of tungsten, zirconia, or any of the above doped with one or more other minerals or elements, and any combination thereof. Suitable metal oxide abrasive may be produced by any of a variety of techniques, including sol-gel, hydrothermal, hydrolytic, plasma, pyrogenic, aerogel, fuming and precipitation techniques, and any combination thereof.

Precipitated metal oxides and metalloid oxides may be obtained by known processes by reaction of metal salts and acids or other precipitating agents. Pyrogenic metal oxide and/or metalloid oxide particles are obtained by hydrolysis of a suitable, vaporizable starting material in an oxygen/hydrogen flame. An example is pyrogenic silicon dioxide from silicon tetrachloride. The pyrogenic oxides of aluminum oxide, titanium oxide, zirconium oxide, silicon dioxide, cerium oxide, germanium oxide, and vanadium oxide and chemical and physical mixtures thereof are suitable abrasives.

In an embodiment, the abrasive comprises a mixed oxide consisting of the two molecular species $SiO_2$ and $Al_2O_3$. In an embodiment, the abrasive comprises alumina coated silica. In one embodiment, the metal oxide abrasive comprises a precipitated or fumed abrasive, preferably a fumed abrasive. In a preferred embodiment, a fumed metal oxide abrasive may be a fumed silica, a fumed alumina, or a fumed silica/alumina.

A most preferred abrasive is silica. The silica can be any of precipitated silica, fumed silica, pyrogenic silica, silica doped with one or more adjutants, or any other silica-based compound and combinations thereof. In an embodiment, the silica can be produced, for example, by a process selected from the group consisting of a sol-gel process, a hydrothermal process, a plasma process, a fuming process, a precipitation process, and any combination thereof. In certain embodiments the silica particle surface may be modified. There are various methods of particle modification described in the prior art including, but not limited to, U.S. Pat. No. 9,567,491, US2017/090936, U.S. Pat. Nos. 9,074,118, 9,309,442, 9,303,188, which are incorporated by reference as if fully set forth herein.

In certain embodiments, the silica particles may have permanent positive charge >5 mV or more preferably greater than 10 mV or most preferably greater than 25 mV in the CMP slurry. In certain other embodiments, the silica particles may have permanent positive charge less than 5 mV or more preferably less than −10 mV or most preferably less than −25 mV in the CMP slurry. In certain preferred embodiments the zeta potentials of the particles in the slurry is between −5 mV to 5 mV. As used herein, zeta potential refers to the potential difference between the dispersion medium and the stationary layer of fluid attached to the dispersed particle.

In certain embodiments, a total surface hydroxyl group density is greater than about 1.5 hydroxyl groups per $nm^2$, or more preferably greater than 4 hydroxyl groups per $nm^2$ or most preferably greater than 5 hydroxyl groups per $nm^2$. In other embodiments, a total surface hydroxyl density less than 4 hydroxyl groups per $nm^2$ is preferred. The silica in one embodiment is advantageously at a particle size measured by dynamic light scattering between about 2 and about 300 nanometers, for example between about 30 and about 250 nanometers, or more preferably between 100 nm and 180 nm.

Abrasive particles may be purified using suitable methods such as ion exchange to remove metal impurities such as sodium, potassium, aluminum, iron, etc. Alternatively, high purity abrasive particles are used. In certain preferred embodiments, the total metal content in the silica particles is less than 100 ppm, or more preferably less than 10 ppm, or most preferably less than 1 ppm.

The above-mentioned abrasives may be used alone or in combination with one another. In embodiments, two or more abrasive particles with different sizes may be combined to obtain excellent performance. In preferred embodiments of the present invention, the abrasive is selected from the group consisting of colloidal silica, fumed silica, alumina, titania, ceria, zirconia, surface modified particles selected from the group consisting of activator-containing particles, composite particles, lattice doped and inorganic oxide particles, and combinations thereof.

The concentration of abrasive can range from 0.01 weight percent to 30 weight percent, more preferably from about 0.05 weight percent to about 10 weight percent, and most preferably from about 0.1 and 4 weight percent of the CMP composition at the point-of-use concentration. In embodiments, the slurry will be made in concentrated form and diluted prior to use. The abrasive concentrations in the concentrated slurries would be much higher.

Oxidizing Agent

The CMP slurries of the present invention comprise an oxidizing agent (also referred to herein as an oxidizer) for chemical etching of material. The oxidizing agent of the CMP slurry contacts the substrate and assists in the chemical removal of targeted material on the substrate surface. The oxidizing agent component is thus may enhance or increase the material removal rate of the composition. Preferably, the amount of oxidizing agent in the composition is sufficient to assist in the chemical removal process, while being as low as possible to minimize handling, environmental, or similar or related issues such as cost.

Advantageously, in one embodiment, the oxidizer is a component which will, upon exposure to at least one activator, produce highly oxidizing free radicals. The free radicals described infra will oxidize most metals and will make the surface more susceptible to oxidation from other oxidizers. However, oxidizers are listed separately from the "Compound Producing Free Radicals", to be discussed infra, because some oxidizers do not readily form free radicals when exposed to the activators. In some embodiments, it is advantageous to have one or more oxidizers which provide matched etching or preferential etching rates on a variety of combinations of metals which may be found on a substrate.

As is known in the art, some oxidizers are better suited for certain components than for other components. In some embodiments of this invention, the selectivity of the CMP system to one metal as opposed to another metal is maximized, as is known in the art. However, in certain embodiments of present invention, the combination of oxidizers is selected to provide substantially similar CMP rates (as opposed to simple etching rates) for a conductor and a barrier combination.

In an embodiment, the oxidizing agent is an inorganic or organic per-compound. A per-compound, as used herein, is defined as a compound containing an element in its highest state of oxidation, such as perchloric acid, or a compound containing at least one peroxy group (—O—O—), such as peracetic acid and perchromic acid. Suitable per-compounds containing at least one peroxy group include, but are not limited to, peracetic acid or salt thereof, a percarbonate, and an organic peroxide, such as benzoyl peroxide, urea hydrogen peroxide, and/or di-t-butyl peroxide.

Suitable per-compounds containing at least one peroxy group include peroxides. As used herein, the term "peroxides" encompasses R—O—O—R', where R and R' are each independently H, a $C_1$ to $C_6$ straight or branched alkyl, alkanol, carboxylic acid, ketone (for example), or amine, and each of the above can independently be substituted with one or more benzyl group (for example benzoyl peroxide) which may themselves be substituted with OH or $C_1$-$C_5$ alkyls, and salts and adducts thereof. This term therefore includes common examples such as hydrogen peroxide, peroxyformic acid, peracetic acid, propaneperoxoic acid, substituted or unsubstituted butaneperoxoic acid, hydroperoxy-acetaldehyde. Also encompassed in this term are common complexes of peroxides, for example urea peroxide.

Suitable per-compounds containing at least one peroxy group include persulfates. As used herein, the term "persulfates" encompasses monopersulfates, di-persulfates, acids, salts, and adducts thereof. Included, for example, is peroxydisulfates, peroxymonosulf uric acid and/or peroxymonosulfates, Caro's acid (peroxysulfuric acid), including for example a salt such as potassium peroxymonosulfate, but preferably a non-metallic salt such as ammonium peroxymonosulfate. Suitable per-compounds containing at least one peroxy group include perphosphates, defined as above and including peroxydiphosphates.

Suitable per-compounds that do not contain a peroxy group include, but are not limited to, periodic acid and/or any periodate salt (hereafter "periodates"), perchloric acid and/or any perchlorate salt (hereafter "perchlorates"), perbromic acid and/or any perbromate salt (hereafter "perbromates"), and perboric acid and/or any perborate salt (hereafter "perbromates").

Other oxidizing agents are also suitable components of the composition of the present invention. Iodates are suitable oxidizers. Also, ozone is a suitable oxidizing agent either alone or in combination with one or more other suitable oxidizing agents. Two or more oxidizers may also be combined to obtain synergistic performance benefits.

The oxidizer concentration can range from 0.01 weight percent to 30 weight percent, while the more preferred amount of oxidizing agents is from about 0.1 weight percent to about 6 weight percent. The weight percent is relative to the composition.

In preferred embodiments of the present invention, the oxidizer is selected from the group consisting of a peroxy compound selected from the group consisting of hydrogen peroxide, urea peroxide, peroxyformic acid, peracetic acid, propaneperoxoic acid, substituted or unsubstituted butaneperoxoic acid, hydroperoxy-acetaldehyde, potassium periodate, ammonium peroxymonosulfate, and non-per-oxy compound selected from the group consisting of ferric nitrite, $KClO_4$, $KBrO_4$, $KMnO_4$.

Amidine Compound

CMP formulations of this invention comprise at least one amidine compound, or a hydrolyzed derivative thereof. As used herein, the term "hydrolyzed derivative" means any molecular structure that results from the reaction of a compound with water. An amidine compound is characterized by the presence of an amidine group containing a carbon atom bonded with one nitrogen atom by a double bond and another nitrogen atom by a single bond. A representative amidine compound has a structure as shown below in Formula I.

Formula (I)

The $R_1$, $R_2$, $R_3$, $R_4$ groups are independently selected from oxygen, nitrogen, hydrogen, carbon, a heterocyclic carbon ring, saturated or unsaturated cyclic groups which may be substituted or unsubstituted, a linear or branched alkyl group which may be saturated or optionally include unsaturated and which may include a saturated or unsaturated cyclic groups, or a saturated or unsaturated ring structure formed from two or three of R1, R2, R3, R4, the ring optionally being substituted. A preferred amidine compound is 2-phenyl-2-imidazoline, In a preferred embodiment, the amidine compound has at least one pKa greater than 8, or preferably more than 10, or most preferably greater than 11. In a preferred embodiment, the amidine group is a part of heterocyclic carbon ring. In a more preferred embodiment, the amidine group is part of a bicyclic carbon compound. In a most preferred embodiment, the amidine group is a bicyclic amidine compound. In some preferred embodiments, the amidine group is a bicyclic amidine compound having a positive charge distribution.

Preferred bicyclic amidine compounds include, but are not limited to, 1,8-Diazabicyclo[5.4.0]undec-7-ene, 1,8-Diazabicyclo[5.4.0]undec-7-ene solution, 1,5-Diazabicyclo[4.3.0]non-5-ene, 1,5,7-Triazabicyclo[4.4.0]dec-5-ene, 7-Methyl-1,5,7-triazabicyclo[4.4.0]dec-5-ene, 3,3,6,9,9-Pentamethyl-2,10-diazabicyclo[4.4.0]dec-1-ene, 1,5-Diazabicyclo[4.3.0]non-5-ene. A more preferred bicyclic amidine compound is 1,8-Diazabicyclo[5.4.0]undec-7-ene, also referred to herein as PolyCAT DBU or DBU.

In some embodiments, the amidine compounds comprise hydrolyzed derivatives (or forms) of bicyclic amidine compounds. An example of a hydrolysis reaction of bicyclic amidine compound (1,8-Diazabicyclo[5.4.0]undec-7-ene) is shown below as Equation 1:

Equation 1

Hydrolysis reactions occur when the amidine compound is dissolved in water under the conditions where the pH is alkaline. In certain embodiments, CMP slurry is prepared using amidine compounds dissolved in water as a raw material. In this case, the amidine compound would hydrolyze and remain in the hydrolyzed form in the CMP slurry formulation.

The presence of hydrolyzed products can be detected by any suitable analysis techniques such as High Performance Liquid Chromatography (HPLC) or HPLC/MS (Mass Spectroscopy). Hydrolysis reaction may take place over a time range between 1 minute to 240 hours, or preferably between 10 hours to 48 hours after the amidine compound is added to water. The kinetics of hydrolysis may also be modified by changing process conditions such as temperature, concentration, etc.

Alternatively, when the amidine compound (with pKa greater than the slurry pH or preferably with pKa greater than 8) is directly added to the acidic slurry formulation, the amidine compound would not hydrolyze, as the compound is stable in protonated form at an acidic pH.

The concentration of bicyclic amidine compound or its hydrolyzed form in the CMP slurry may range from 0.00001 weight percent to 1 weight percent, or preferably between 0.0001 weight percent to 0.1 weight percent, or most preferably between 0.001 weight percent and 0.1 weight percent.

Solvent

Preferred solvents include, but are not limited to, water, a polar solvent selected from the group consisting of alcohol, ether, ketone, other polar reagent and combinations thereof, and a mixture of water and polar solvent. "Other polar reagents" as referred to herein include, but are not limited to, glycols and organic acids. The concentration of solvent in the composition is 90 percent by weight or greater of the composition.

Activator

In some embodiments the CMP composition may optionally comprise and activator. The activator, also referred to herein as a catalyst, is a material that facilitates the formation of free radicals by having at least one free radical-producing compound present in the fluid. If the activator is a metal ion, or metal-containing compound, it is in a thin layer associated with a surface of a solid which contacts the fluid. If the activator is a non-metal-containing substance, it can be dissolved in the fluid. It is preferred that the activator is present in an amount that is sufficient to promote the desired amount of free radical formation.

For example, activators or catalysts of U.S. Pat. Nos. 7,014,669, 6,362,104, 5,958,288, 8,241,375, 7,887,115, 6,930,054, US patent application numbers US2014315386, US2016280962, and Korean publication number KR1020110036294, the disclosures of which are incorporated by reference, as if fully set forth herein, can be used in this capacity. An activator can be present in the slurry, on the polishing pad, or can be present where the slurry containing oxidizer contacts the activator prior to passing between the pad and a wafer substrate.

Activators may be present in one or more different forms. Examples of different forms of activators include, but are not limited to, (i) soluble activator compound in the slurry (ii) particle with a surface modified with activator compound (iii) particles with activator included in both the particle core and the surface (iv) core-shell composite particles comprising activator exposed on the surface.

In one embodiment, the activator is any metal-containing compound known to be useful in Fenton's reactions as an activator, wherein the oxidizer is a peroxide, particularly hydrogen peroxide. Transition metals like manganese, cobalt, and cerium, as well as the more traditional iron and copper, are able to catalyze this reaction. In a preferred embodiment, the activator comprises a metal-containing compound having a metal other than a metal of Group 4(b), Group 5(b) or Group 6(b) of the Periodic Table of Elements. In one embodiment, compounds of metals of Group 1(b) or Group 8 are preferred metal-containing activators.

Metal-containing activator compounds can be used in the form of a soluble compound in the slurry. Suitable activator compounds for the pH range of this invention include, but are not limited to, ammonium iron (III) oxalate trihydrate, iron(III) nitrate and hydrates thereof, iron(III) citrate tribasic monohydrate, iron(III) acetylacetonate and ethylenediaminetetraacetic acid, iron (III) sodium salt hydrate. A soluble activator can also be a metal compound of Ag, Co, Cr, Cu, Fe, Mo, Mn, Nb, Ni, Os, Pd, Ru, Sn, Ti, V and mixtures thereof having multiple oxidation states. In most embodiments of the present invention, the activator includes, but is not limited to, transition metals.

In an embodiment, the activator may be a non-metal-containing compound. Iodine is a useful activator with, for example, hydrogen peroxide, to form free radicals. The iodine is present in an amount sufficient to create the desired free radical activity. In some embodiments, the iodine may be present in an amount ranging from about 1 ppm to about 5000 ppm, preferably between about 10 ppm and about 1000 ppm. In an embodiment, non-metallic activators are synergistically combined with metal-containing activators In an embodiment, the activator is a light-activated activator such as titanium oxide (and light used as an activator). The photoactivated materials of U.S. Pat. No. 6,362,104, the disclosure of which is incorporated by reference as if fully set forth herein, can be used in this capacity.

In embodiments where an activator is present, the amount of activator in the CMP slurry ranges from about 0.0005 weight percent to about 10 weight percent, preferably 0.001 weight percent to 2 weight percent, more preferably between 0.005 weight percent to 0.1 weight percent, and most preferably between 0.01 weight percent to 0.05 weight percent of the total CMP composition.

Compound Producing Free Radicals

In an embodiment the CMP composition optionally comprises a compound producing free radicals (also referred to herein as a free radical-producing compound) which will, upon exposure to at least one activator, produce free radicals capable of giving an increased etching rate on at least selected structures of the substrate. As used herein, the term free radical-producing compound means a compound which will, upon exposure to at least one activator, be capable of producing a free radical. A free radical, as used herein, is a chemical component that contains a free electron which covalently bonds with a free electron on another molecule or atom. Free radicals are also generally described as molecular fragments having one or more unpaired electrons. Free radicals are usually both short-lived and also are highly reactive. In spite of their transitory existence, free radicals can initiate many chemical reactions.

In a preferred embodiment the free radical is a reactive oxygen radical. Any free radical involving oxygen can be referred to as reactive oxygen radical. The oxygen-containing hydroxyl radical is one of the most reactive chemical species known, second only to elemental fluorine in its reactivity. This is a preferred free radical. The oxygen singlet is another preferred free radical.

In one embodiment the preferred free radical producing compounds in the CMP slurry comprise peroxide compounds, persulfates compounds, peroxydiphosphate compounds, ozone, or a mixture thereof. In an embodiment the free radical producing compound comprises hydroxylamine. The most preferred free radical-producing compounds are peroxide compounds. In one embodiment the most preferred free radical-producing compounds are peroxide compounds, for example hydrogen peroxide, urea peroxide, hydrogen peroxide, or substituted peroxides such as t-butyl peroxide (CAS #110-05-9) or t-butyl hydroperoxide (CAS #75-91-2), or mixtures thereof, most preferably hydrogen peroxide. In another embodiment one or more are present in a total amount ranging from about 0.01 percent to about 10 percent, preferably from about 0.1 percent to about 5 percent.

Dishing Reducer

In an embodiment, the CMP slurry formulation may optionally comprise a dishing reducing additive, also referred to herein as a dishing reducer, to reduce tungsten (or other conductive metal) etching and corrosion during CMP.

Suitable dishing reducing additives or dishing reducers include, but are not limited to: sarcosinates and related carboxylic compounds; hydrocarbon substituted sarcosinate; amino acids; organic polymers and copolymers having molecules containing ethylene oxide repeating units, such as polyethylene oxide (PEO); ethoxylated surfactant; nitrogen containing heterocycles without nitrogen-hydrogen bonds, sulfides, oxazolidines or mixtures of functional groups in one compound; nitrogen containing compounds having three or more carbon atoms that form alkylammonium ions; amino alkyls having three or more carbon atoms; polymeric corrosion inhibitors comprising repeating group of at least one nitrogen-containing heterocyclic ring or a tertiary or quaternary nitrogen atom; polycationic amine compounds; cyclodextrin compounds; polyethyleneimine compounds; glycolic acid; chitosan; sugar alcohols; polysaccharides; alginate compounds; phosphonium compounds and sulfonic acid polymers. Preferred dishing reducers include, but are not limited to, amino acids. Glycine is a more preferred dishing reducer. In embodiments where dishing reducer is present, the amount of dishing reducer ranges from 1 ppm to 10,000 ppm, more preferably 10 ppm to 5000 ppm, and most preferably 100 to 1000 ppm based on weight per weight of the entire CMP composition.

Stabilizer

In embodiments, the CMP composition may also optionally include stabilization agents, also referred to herein as stabilizers. These optional stabilization agents are generally employed to facilitate or promote stabilization of the composition against settling, flocculation (including precipitation, aggregation or agglomeration of particles, and the like), and decomposition. Stabilizers can be used to extend the pot-life of the oxidizing agent(s), including compounds that produce free radicals, by isolating the activator material, quenching free radicals, or by otherwise stabilizing the compounds that form free radicals.

In an embodiment, some materials are useful to stabilize hydrogen peroxide. One exception to the metal contamination is the presence of selected stabilizing metals such as tin. In some embodiments of this invention, tin can be present in small quantities, typically less than about 25 ppm, for example, between about 3 and about 20 ppm. Similarly, zinc is often used as a stabilizer. In some embodiments of this invention, zinc can be present in small quantities, typically less than about 20 ppm, for example, between about 1 and about 20 ppm. In another preferred embodiment the fluid composition contacting the substrate has less than 500 ppm, for example, less than 100 ppm, of dissolved metals, except for tin and zinc, having multiple oxidation states. In the most preferred embodiments of this invention, the fluid composition contacting the substrate has less than 9 ppm of dissolved metals having multiple oxidation states, for example, less than 2 ppm of dissolved metals having multiple oxidation states, except for tin and zinc. In some preferred embodiments of this invention, the fluid composition contacting the substrate has less than 50 ppm, preferably less than 20 ppm, and more preferably less than 10 ppm of dissolved total metals, except for tin and zinc.

As metals in solution are generally discouraged, it is preferred that those non-metal-containing oxidizers that are typically present in salt forms, for example persulfates, are in the acid form and/or in the ammonium salt form, such as ammonium persulfate.

Other suitable stabilizers include free radical quenchers. These will impair the utility of the free radicals produced. Therefore, it is preferred that, if present, they are present in small quantities. Most antioxidants, i.e., vitamin B, vitamin C, citric acid, and the like, are free radical quenchers. Most organic acids are free radical quenchers, but three that are effective and have other beneficial stabilizing properties are phosphonic acid, the binding agent oxalic acid, and the non-radical-scavenging sequestering agent gallic acid.

In addition, carbonate and phosphate will bind onto the activator and hinder access of the fluid. Carbonate is particularly useful as it can be used to stabilize a slurry, but a small amount of acid can quickly remove the stabilizing ions. In an embodiment, stabilization agents suitable for an absorbed activator can be film forming agents forming films on the silica particle.

Suitable stabilizing agents include organic acids such as adipic acid, phthalic acid, citric acid, malonic acid, orthophthalic acid, phosphoric acid, substituted or unsubstituted phosphonic acids, i.e., phosphonate compounds; nitriles; and other ligands, such as those that bind the activator material and thus reduce reactions that degrade the oxidizing agent, and any combination of the foregoing agents. As used herein, an acid stabilizing agent refers to both the acid stabilizer and its conjugate base. That is, the various acid stabilizing agents may also be used in their conjugate form. By way of example, herein, an adipic acid stabilizing agent encompasses adipic acid and/or its conjugate base, a carboxylic acid stabilizing agent encompasses carboxylic acid and/or its conjugate base, carboxylate, and so on for the above-mentioned acid stabilizing agents. A suitable stabilizer, used alone or in combination with one or more other stabilizers, decreases the rate at which an oxidizing agent such as hydrogen peroxide decomposes when admixed into the CMP slurry. Malonic acid is a preferred stabilizer.

In contrast, the presence of a stabilization agent in the composition may compromise the efficacy of the activator. The amount should be adjusted to match the required stability with the lowest adverse effect on the effectiveness of the CMP system. In general, any of these optional additives should be present in an amount sufficient to substantially stabilize the composition. The necessary amount varies depending on the particular additive selected and the particular make-up of the CMP composition, such as the nature of the surface of the abrasive component. If too little of the additive is used, the additive will have little or no effect on the stability of the composition. Alternatively, if too much of the additive is used, the additive may contribute to the formation of undesirable foam and/or flocculant in the composition. Preferably, suitable amounts of these optional stabilization agents range from about 0.001 to about 2 weight percent relative to the composition, and preferably from about 0.001 to about 1 weight percent. These optional stabilization agents may be added directly to the composition or applied to the surface of the abrasive component of the composition. In embodiments comprising activator compounds attached to a solid surface, a stabilizer compound may not be required to prevent degradation of the oxidizer once it is added to the slurry.

In preferred embodiments, loss of hydrogen peroxide oxidizer in the slurry formulation after 7 days of aging at room temperature is less than 10 percent, or more preferably less than 5 percent relative to original hydrogen peroxide concentration.

pH Adjustors

The pH of the CMP composition is preferably on the order of from about pH 1 to about pH 14, and more preferably from about pH 1 to about pH 7, and most preferably from about pH 2 to about pH 5. The pH of the composition may be adjusted using an appropriate pH adjusting agent, such as a suitable acid, base, amine, or any combination thereof. Preferably, a pH adjusting agent used in the composition does not contain metal ions, such that undesirable metal components are not introduced into the composition. Suitable pH adjusting agents include amines, ammonium hydroxide, nitric acid, phosphoric acid, sulfuric acid, organic acids, and/or salts thereof, and any combination thereof.

The composition may comprise from 0 weight percent to 1 weight percent, preferably 0.005 weight percent to 0.5 weight percent, more preferably 0.02 weight percent to 0.2 weight percent of the pH adjusting agent selected from the group consisting of nitric acid, hydrochloric acid, sulfuric acid, phosphoric acid, other inorganic or organic acids, and mixtures thereof for acidic pH conditions, or selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions.

Biocide

In embodiments, the CMP composition may comprise biological growth inhibitors or preservatives to prevent bacterial and fungal growth during storage.

The biological growth inhibitors include, but are not limited to, tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, and sodium hypochlorite.

Some of the commercially available preservatives include KATHON™ and NEOLENE™ product families from Dow Chemicals, and Preventol™ family from Lanxess. More are disclosed in U.S. Pat. No. 5,230,833 (Romberger et al.) and US Patent Application No. US 20020025762. The contents of which are hereby incorporated by reference as if set forth in their entireties.

The use of biocide in enclosed CMP polishing compositions reduces or eliminates bacteria and other microorganisms, especially when the pH values of the CMP polishing compositions is close or around neutral pH conditions. The biocide ranges from about 0.0001 weight percent to about 0.03 weight percent of the CMP composition.

Surfactants

In an embodiment, a surfactant may optionally be present. Suitable surfactants include anionic, cationic, nonionic, zwitterionic surfactant or amphoteric surfactant or a combination of two or more surfactants. Various anionic and cationic surfactants having molecular weight in the range from less than 1000 to greater than 30,000 may be used as dispersants. Suitable surfactants include, but are not limited to, lauryl sulfate, alkyl polyphosphate, dodecyl benzene sulfonate, disopropylnaphthalene sulfonate, dioctylsulfosuccinate, ethoxylated and sulfated lauryl alcohol, and ethoxylated and sulfated alkyl phenol.

Suitable cationic surfactants include, but are not limited to, polyethyleneimine, ethoxylated fatty amine and stearylbenzyldimethylammonium chloride or nitrate. Alternate dispersants include: polyethylene glycols, lecithin, polyvinyl pyrrolidone, polyoxyethylene, isoctylphenyl ether, polyoxyethylene nonylphenyl ether, amine salts of alkylaryl sulfonates, polyacrylate and related salts and polymethacrylate.

Preferably, a surfactant used in the CMP slurry should be sufficient to achieve effective stabilization of the slurry and will typically vary depending on the particular surfactant selected and the nature of the surface of the metal oxide abrasive. For example, if not enough of a selected surfactant is used, it will have little or no effect on CMP slurry stabilization. Alternatively, too much surfactant in the CMP slurry may result in undesirable foaming and/or flocculation.

It also has been found that the addition of a surfactant may be useful to reduce the within-wafer-non-uniformity (WIWNU) of the wafers, thereby improving the surface of the wafer and reducing wafer defects. While there are many suitable surfactant additives for the composition, preferred surfactant additives include dodecyl sulfate sodium salt, sodium lauryl sulfate, dodecyl sulfate ammonium salt, and any combination thereof. Suitable commercially available surfactants include TRITON DF 16™ manufactured by Union Carbide and SURFYNOL™ manufactured by Air Products and Chemicals.

When present, the surfactant generally is present in an amount ranging from about 0.001 percent to about 0.2 percent by weight, and preferably from about 0.001 to about 0.1 weight percent based on the total weight of the CMP composition.

Furthermore, the surfactant additive may be added directly to the slurry or treated onto the surface of the metal oxide abrasive utilizing known techniques. In either case, the amount of surfactant additive is adjusted to achieve the desired concentration in the polishing slurry.

Method of Preparation

Components of the CMP slurry of invention may be mixed together as a single component slurry or may be provided in two or more components to be mixed at point of use. In an embodiment, it is preferable to add an oxidizer at the point of use.

In preferred embodiments, the slurry is provided in a concentrated form so that it can be diluted with a solvent such as water, and the oxidizer can be added prior to use. In embodiments, the slurry is concentrated so that the volume of a solvent, such as water that is added at the point of use is preferably 2 times the volume of the slurry, or more preferably more than 3 times the volume of the slurry, or most preferably more than 5 times the volume of the slurry.

In preferred embodiments the CMP slurry has a pH between 1 and 14, more preferably between 1 and 7, and most preferably between 2 and 5. In an embodiment, the CMP slurry comprises an abrasive, at least one oxidizing agent, an activator, at least one bicyclic amidine compound, and a solvent. In another embodiment, the CMP slurry comprises an abrasive, hydrogen peroxide, a soluble iron compound, an additive to stabilize hydrogen peroxide in the presence of the iron compound, and at least one bicyclic amidine compound. In another embodiment, the CMP slurry comprises an abrasive, at least one oxidizing agent, an activator, and a bicyclic amidine compound wherein the bicyclic amidine compound is 1,8-Diazabicyclo[5.4.0]undec-7-ene (DBU). In a preferred embodiment, the CMP slurry comprises silica particles, hydrogen peroxide, ferric nitrate, glycine, malonic acid, and a bicyclic amidine compound wherein the bicyclic amidine compound is 1,8-Diazabicyclo[5.4.0]undec-7-ene (DBU) and the pH of the slurry is between 1 and 14, more preferably between 1 and 7, and most preferably between 2 and 5.

Method of Use

In a preferred embodiment, the polish rates of the tungsten blanket films at 4 psi downforce and 100 RPM table speed is greater than 1000 Angstrom/minute, or more preferably greater than 2000 Angstrom/minute, or most preferably greater than 3000 Angstrom/minute. In embodiments using the same polish rate and table speed, the erosion of the 9×1 micron array (9 micron wide tungsten line width separated by 1 micron wide dielectric line) measured on a patterned wafer is less than 1500 Angstrom or more preferably less than 1000 Angstrom when the wafer is polished for 15 seconds additional time after the pattern wafer polish end point detected by using is suitable method such as eddy current measurement or optical end point detection.

"Polishing selectivity", as used herein is the removal rate of the tungsten (or other conductive metal) line divided by the removal rate of the dielectric material. In certain embodiments, the desired polishing selectivity between tungsten and TEOS removal rate is between 0.5 to 10, more preferably between 1 and 8, or most preferably between 2 and 5. In other embodiments, the desired polishing selectivity between the tungsten and TEOS removal rate is greater than 25, or more preferably greater than 50, or most preferably greater than 100.

WORKING EXAMPLES

General Experimental Procedure
PARAMETERS:
Angstrom: angstrom(s)—a unit of length
BP: back pressure, in psi units CMP: chemical mechanical planarization=chemical mechanical polishing DF: Down force: pressure applied during CMP, units psi min: minute(s)

ml: milliliter(s)

ppm: parts per million by weight/weight mV: millivolt(s)

psi: pounds per square inch

PS: platen rotational speed of polishing tool, in rpm (revolution(s) per minute)

SF: polishing composition flow, ml/min

TEOS: silicon oxide films by Chemical Vapor Deposition (CVD) using tetraethyl orthosilicate as the precursor Removal Rate (RR): (film thickness before polishing–film thickness after polishing)/polish time.

All concentrations of components are weight percent (wt. %) unless otherwise indicated.

In the examples presented below, CMP experiments were run using the procedures and experimental conditions given below.

The CMP tool that was used in the examples is an Ebara FREX 300, manufactured by Ebara Technologies Inc, Japan. NexPlanarE6088 polishing pad, supplied by Cabot Microelectronics. 300 mm diameter silicon wafers coated with tungsten films TEOS films or tungsten containing SKW patterned structures (Obtained from SKW Associates, Inc. 2920 Scott Blvd. Santa Clara, Calif. 95054) were used. Polish time for blanket films was one minute. Tungsten removal rates were measured using sheet resistance measurement techniques. TEOS removal was measured using optical techniques. Patterned wafers were polished for a time based on eddy current endpoint detection techniques on the Ebara polisher. Polishing time for patterned wafers was 15 seconds past the end point identified by the eddy current end point technique. Patterned wafers were analyzed with a KLA Tencor P15 Profiler (large feature sizes) or an AFM tool (small feature sizes). The polishing was performed using a 4.3 psi downforce, 80 RPM table speed, 81 RPM carrier speed 81 RPM and 100 ml/min slurry flow rate.

Example 1: Tungsten and TEOS Removal Rates for CMP Compositions

CMP compositions were prepared as shown in Table 1, where the concentrations of the components of the composition are expressed as percent by weight of the total composition. CMP compositions 1 and 2 contained 100 ppm and 500 ppm of 1,8-Diazabicyclo[5.4.0]undec-7-ene (DBU), respectively. The pH of the composition was 2.3. The solvent used was water which made the total weight of the composition to 100 percent.

TABLE 1

|  | Composition | |
| --- | --- | --- |
|  | 1 | 2 |
| Silica Abrasive Particles (FUSO PL-7) (wt. %) | 1.3 | 1.3 |
| Glycine(wt. %) | 0.100 | 0.100 |
| Malonic Acid (wt. %) | 0.08 | 0.08 |
| Ferric (III) Nitrate Nonahydrate (wt. %) | 0.01 | 0.01 |
| 1,8-Diazabicyclo[5.4.0]undec-7-ene (wt. %) | 0.01 | 0.05 |
| Hydrogen peroxide (wt. %) | 2 | 2 |
| pH | 2.3 | 2.3 |

Tungsten and TEOS blanket films and a patterned tungsten film were polished on a Mirra polisher at 4 psi membrane and 120 RPM table speed with 120 ml/min flow rate. Fuso PL7 cocoon shaped high purity colloidal silica abrasive particles with approximately 125 nm aggregate size as measured by dynamic light scattering used were obtained from Fuso Chemical Co, Ltd. (2-5, Nihonbashi-Honcho 2-chome, Chuo-ku, Tokyo 103-00, Japan).

Tungsten and blanket removal rates were obtained and summarized in Table 2. The removal rates are expressed in units of Angstroms per minute.

TABLE 2

| Composition | Tungsten Removal Rate (Angstrom/min.) | TEOS Removal Rate (Angstrom/min.) |
| --- | --- | --- |
| 1 | 4,574 | 1,130 |
| 2 | 4,328 | 1,060 |

Example 2: Dishing for CMP Compositions

The data in Table 2 demonstrates that both compositions had a high removal rate for tungsten and a lower removal rate for TEOS. The compositions used in Example 1 were tested for tungsten dishing.

Dishing of tungsten was tested on different arrays, including, 9×1 micron array (tungsten line width/trench separated by dielectric line width/spacer in micron), 7×3 micron array, 5×5 micron array, when the wafer was polished for 15 seconds additional time or over polishing (OP) time after the pattern wafer polish end point was detected by using eddy current measurement. The dishing data is shown in Table 3.

The dishing data showed that both compositions provided low dishing (less than 500 Angstrom) for all the featured arrays' size of structures. The dishing was less than 300 Angstrom for the 9×1 micron structure.

TABLE 3

| | Dishing (Angstrom) | |
| --- | --- | --- |
| Array | Composition 1 | Composition 2 |
| 9/1 | 288 | 223 |
| 7/3 | 401 | 347 |
| 5/5 | 394 | 363 |

The results in Table 3 demonstrate that Compositions 1 and 2, comprising the DBU additive, provide low dishing (less than 1200 Angstrom) for polishing tungsten containing wafers. DBU has a pKa value of approximately 13.5 so at the CMP formulation's pH it is almost completely protonated, resulting in an overall+1e− charge. Without being bound by any particular theory, it is believed that having a molecule with a positive charge distribution likely results in a strong electrostatic interaction with the negatively charged hydroxylated WOx (tungsten oxide) surface expected to be present at the formulation pH. At the high lying areas of the wafer, the pad can push away this protective layer so the W removal rate is not strongly impacted; however, the protective layer over the low lying areas is likely to remain intact due to the strong interaction and lower local pressure thus results in improved topography as demonstrated in the experiments.

Example 3: CMP Compositions with Hydrolyzed DBU Vs. Non-Hydrolyzed DBU

The CMP slurry formulation listed in Table 4 was prepared using two different methods. In the first method, the CMP slurry was prepared by directly adding the 0.02 weight percent DBU raw material to the slurry, where the DBU was non-hydrolyzed. In the second method, a 10 weight percent of DBU in water was prepared, stored for 2 days, and then 0.02 weight percent of hydrolyzed DBU was added to the CMP slurry. Hydrogen peroxide was added to make up 2 weight percent in the slurry formulation at the point of use. Patterned tungsten wafers were polished as per the polishing method described in Example 2 and the various dishing and erosion parameters were measured. The dishing and erosion results are summarized in FIGS. 2 and 3, respectively.

TABLE 4

|  | Concentration (wt. %) |
|---|---|
| Glycine | 0.1 |
| Fuso PL-7 colloidal silica particles | 1.5 |
| Iron (III) Nitrate Nonahydrate | 0.01 |
| Malonic Acid | 0.08 |
| DBU | 0.02 |

Figure 2:
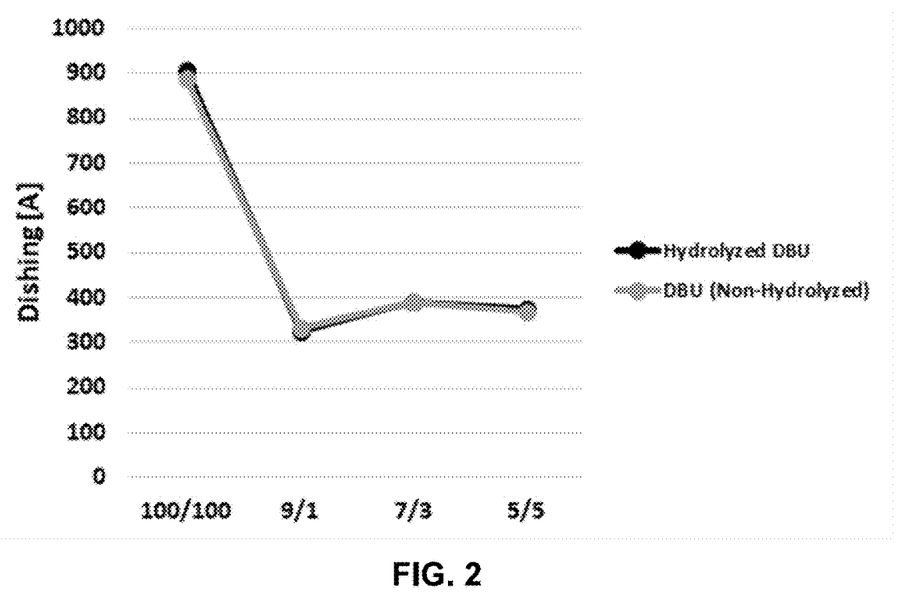
FIG. 2 compares dishing measured on tungsten patterned wafers using hydrolyzed or non-hydrolyzed 1,8-Diazabicyclo[5.4.0]undec-7-ene (DBU)
Figure 3:
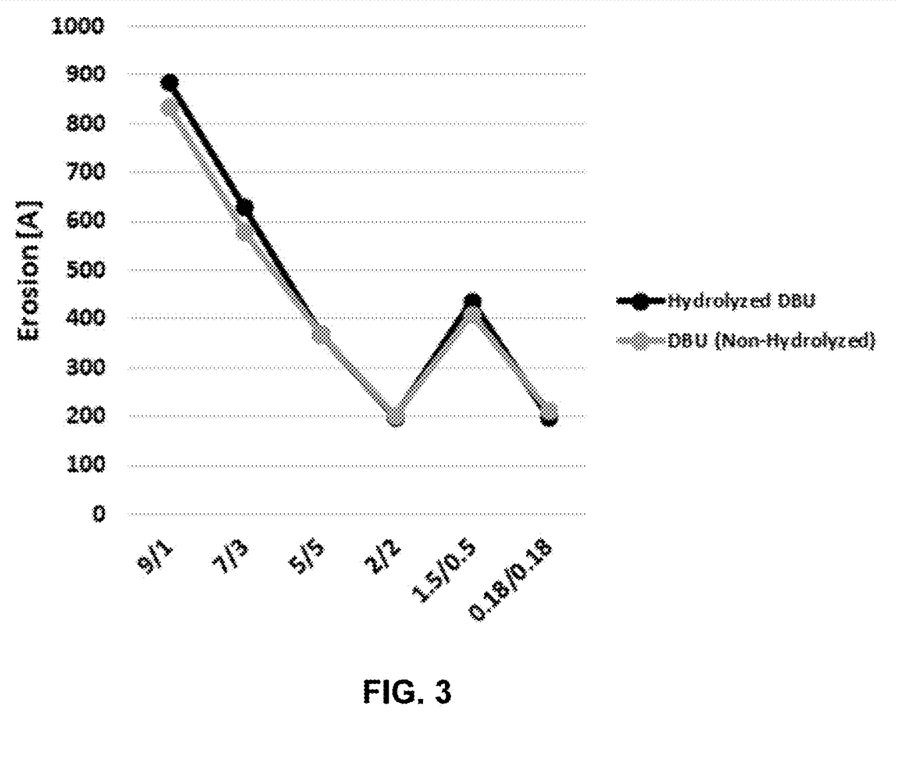
FIG. 3 compares erosion measured on tungsten patterned wafers using hydrolyzed or non-hydrolyzed 1,8-Diazabicyclo[5.4.0]undec-7-ene (DBU)

FIGS. 2 and 3 show that the CMP slurry formed by either methods, that is, DBU was either hydrolyzed or non-hydrolyzed, gave similar results.

The results demonstrated that the compositions with the use of the DBU provide low dishing (less than 1200 Angstrom) and low erosion (less than 500 Angstrom) for polishing tungsten containing wafers.

Example 4 Low Selectivity Slurry Versus High Selectivity Slurry

Low Selectivity Slurries were prepared in the same manner as the compositions of Example 1, and High Selectivity Slurries was prepared using compositions shown in Table 5. Selectivity is defined as the general ratio of polish RR between tungsten and TEOS. Both slurries contained 0.02 percent hydrolyzed DBU, or no additive. The dishing and erosion results for the low selectivity slurry containing DBU compared to a slurry with no additive are summarized in Table 6. The results show that for a low selectivity slurry, the composition containing DBU has decreased dishing and erosion on most pattern features compared to a composition with no DBU additive.

TABLE 5

| High Selectivity Slurry Composition | | |
|---|---|---|
| Composition | DBU | No additive |
| Cationic Silica Abrasive Particles (FUSO PL-3C) (wt. %) | 0.1 | 0.1 |
| Glycine(wt. %) | 0.100 | 0.100 |
| Malonic Acid (wt. %) | 0.08 | 0.08 |
| Ferric (III) Nitrate Nonahydrate (wt. %) | 0.01 | 0.01 |
| 1,8-Diazabicyclo[5.4.0]undec-7-ene (wt. %) | 0.02 | 0 |
| Hydrogen peroxide (wt. %) | 2 | 2 |
| pH | 2.3 | 2.3 |

TABLE 6

| Low Selectivity Slurry Dishing and Erosion | | |
|---|---|---|
|  | No additive | 0.02% additive |
| Dishing | | |
| 0.5/0.5 | 208 | 176 |
| 0.18/0.18 | 255 | 244 |

TABLE 6-continued

| Low Selectivity Slurry Dishing and Erosion | | |
|---|---|---|
|  | No additive | 0.02% additive |
| 1/1 | 203 | 180 |
| 10/10 | 490 | 446 |
| Erosion | | |
| 9/1 | 1169 | 1129 |
| 0.5/0.5 | 305 | 313 |
| 0.18/0.18 | 374 | 348 |
| 1/1 | 385 | 316 |

The dishing results for the high selectivity slurry containing DBU compared to a slurry with no additive are summarized Table 7. The results show that for a high selectivity slurry, the composition containing DBU has decreased dishing on most features compared to a composition with no DBU additive.

TABLE 7

| High Selectivity Slurry (W5750-381) | | |
|---|---|---|
| Dishing | No additive | 0.02% additive |
| 0.5/0.5 | 195 | 149 |
| 0.18/0.18 | 209 | 233 |
| 1/1 | 182 | 133 |
| 10/10 | 615 | 570 |

Example 5: High Selectivity Example Using Imidazoline

A High Selectivity Slurry was prepared in the same manner as the compositions of Example 1, but using 2-phenyl-2-imidazoline as the amidine additive. The dishing and erosion results for the slurries containing Imidazoline are summarized Table 8.

TABLE 8

| High Selectivity Slurry using 2-phenyl-2-imidazoline as the amidine additive. | | |
|---|---|---|
|  | 0.029% additive | 0.01% additive |
| Dishing | | |
| 9/1 | 168 | 202 |
| 7/3 | 469 | 524 |
| 5/5 | 489 | 546 |
| Erosion | | |
| 9/1 | 1310 | 1350 |
| 7/3 | 536 | 580 |
| 0.5/0.5 | 334 | 344 |

Example 6: DBU Concentration Effect on Dishing and Erosion at 50 Seconds OP

Slurries were prepared as in Example 1 but with varied concentrations of DBU to evaluate the impact of DBU concentration after 50 seconds of overpolishing. The results of dishing and erosion testing are provided in Table 9. The results show that the DBU concentrations studied show a trend of decreasing dishing and erosion with increased additive concentration.

TABLE 9

DBU Concentration impact on Dishing and Erosion

| | Hydrolyzed DBU Concentration (ppm) | | | |
|---|---|---|---|---|
| Array | 50 | 200 | 300 | 400 |
| DBU Impact on Dishing (Angstroms) | | | | |
| 10 × 10 | 417 | 382 | 368 | 349 |
| 0.18 × 0.18 | 202 | 190 | 188 | 188 |
| 0.5 × 0.5 | 196 | 188 | 181 | 175 |
| 1 × 1 | 181 | 167 | 162 | 149 |
| DBU Impact on Erosion (Angstroms) | | | | |
| 9 × 1 | 1124 | 1238 | 1113 | 1076 |
| 0.18 × 0.18 | 425 | 426 | 446 | 391 |
| 0.5 × 0.5 | 290 | 293 | 286 | 247 |
| 1 × 1 | 426 | 413 | 363 | 385 |

Example 7: Comparison of Amidine Additives

Compositions containing different amidine additives were prepared as described in Table 10 and evaluated for dishing and erosion. The amidine compounds evaluated were: 1,8-Diazabicyclo[5.4.0]undec-7-ene (DBU); 1,5-Diazabicyclo [4.3.0]non-5-ene (DBN); 1,5,7-Triazabicyclo [4.4.0]dec-5-ene (TBD); Benzamidine hydrochloride hydrate and 2-Phenyl-2-imidazoline. SKW brand patterned wafer (MIT pattern) were used in the CMP process with a pressure of 2 psi to the detected endpoint plus an additional 10 seconds overpolish (OP). The results for dishing and erosion testing using these compositions is summarized in Table 11. The results show that the composition containing amidine molecules all provided significantly decreased dishing compared to a composition without any additive.

TABLE 10

| Composition | No additive | DBU | DBN | TBD | Benzamidine hydrochloride hydrate | 2-Phenyl-2-imidazoline |
|---|---|---|---|---|---|---|
| Cationic Silica Abrasive Particles (FUSO PL-3C) (wt. %) | 0.1 | 0.1 | 0.1 | 0.1 | 0.1 | 0.1 |
| Glycine (wt. %) | 0.100 | 0.100 | 0.100 | 0.100 | 0.100 | 0.100 |
| Malonic Acid (wt. %) | 0.08 | 0.08 | 0.08 | 0.08 | 0.08 | 0.08 |
| Ferric (III) Nitrate Nonahydrate (wt. %) | 0.01 | 0.01 | 0.01 | 0.01 | 0.01 | 0.01 |
| Additive conc. (wt. %) | 0 | 0.02 | 0.0163 | 0.0183 | 0.0301 | 0.0192 |
| Hydrogen peroxide (wt. %) | 2 | 2 | 2 | 2 | 2 | 2 |
| pH | 2.3 | 2.3 | 2.3 | 2.3 | 2.3 | 2.3 |

TABLE 11

| Dishing | no additive | 1,8-Diazabicyclo [5.4.0]undec-7-ene (DBU) | 1,5-Diazabicyclo [4.3.0]non-5-ene (DBN) | 1,5,7-Triazabicyclo [4.4.0]dec-5-ene (TBD) | Benzamidine hydrochloride hydrate | 2-Phenyl-2-imidazoline |
|---|---|---|---|---|---|---|
| 1/1 | 247 | 227 | 232 | 226 | 246 | 242 |
| 9/1 | 263 | 179 | 198 | 153 | 221 | 237 |
| 7/3 | 548 | 427 | 485 | 435 | 521 | 516 |

2 psi to EP+10 seconds overpolish (OP)
SKW brand patterned wafer (MIT pattern)

Example 8: Zeta Potentials of Slurries Containing Hydrolized DBU

Figure 4:
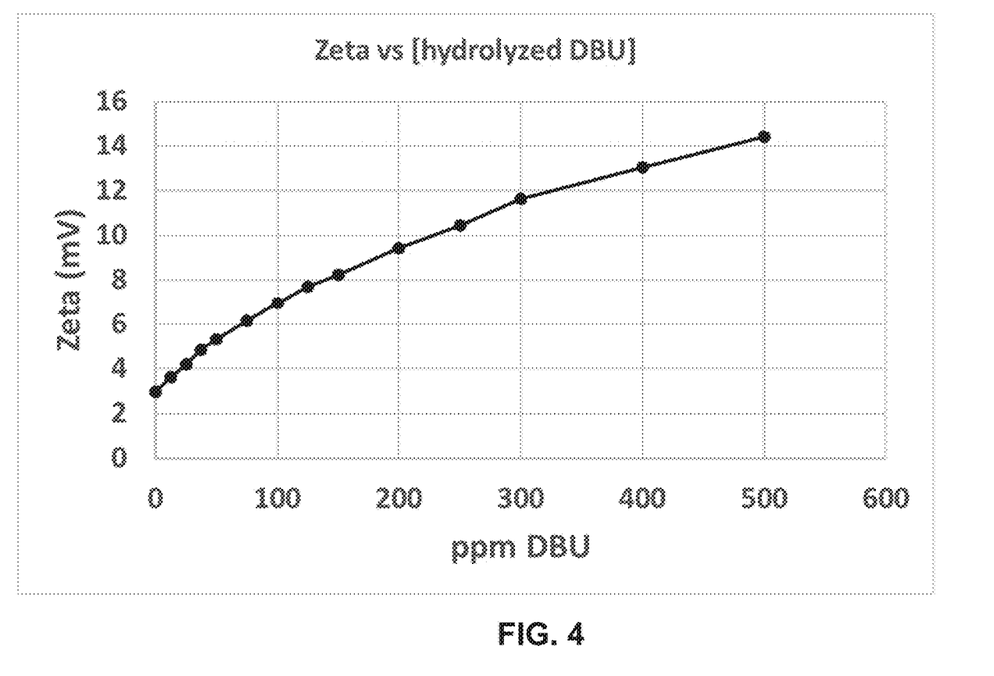
FIG. 4 is a graph of zeta potentials for slurries with varying amounts of hydrolyzed 1,8-Diazabicyclo[5.4.0]undec-7-ene (DBU).

A formulation comprising the essential slurry components of Example 1 excluding hydrolyzed DBU was prepared and examined using a Colloidal Dynamics ZetaProbe instrument to determine the charge on the particle surface. Titration of hydrolyzed DBU into the formulation was performed and the results are shown in FIG. 4. The addition of hydrolyzed DBU led to an increase in the zeta potential. As the zeta potential increases to more positive values, the abrasive particle colloidal stability increases whereby providing a longer shelf-life for the formulation.

Stability of the abrasive particles from aggregation is an important aspect of the shelf life of the formulation. One method of stabilization is via charge repulsion where the particles are coulombically repelled by the charge on each particle. This leads to decreased interaction and aggregation tendencies. The zeta potential is a probe of the charge on the particle surface, and therefore a measure of the colloidal stability of the abrasive in the formulation. Generally, zeta potentials of >+25 mV and <−25 mV are considered strongly coulombically stabilized particles, as the high charge density provides a strong repulsive nature. Hydrolyzed DBU interacts with the particle surface and results in an increase in positive charge. In the case of the silica surface in a formulation at pH 2.3 without hydrolyzed DBU, the zeta potential of silica is slightly positive. Adding increasing amounts of hydrolyzed DBU increases the zeta potential to more positive values, from a value near +3 mV without hydrolyzed DBU to +14.2 mV with 500 ppm (by weight) hydrolyzed DBU.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:

1. A chemical mechanical planarization (CMP) composition comprising:
   at least one amidine compound, or hydrolyzed derivative thereof, selected from the group consisting of 2-phenyl-2-imidazoline and 1,8-Diazabicyclo[5.4.0]undec-7-ene;
   silica;
   hydrogen peroxide;
   ferric nitrate;
   glycine;
   malonic acid; and
   a solvent.

2. The CMP composition of claim 1, wherein the CMP composition comprises a pH ranging from 1 through 7.

3. The CMP composition of claim 1, wherein the CMP composition comprises a pH ranging from 2 through 5.

4. The CMP composition of claim 1, wherein the solvent is selected from the group consisting of: water, alcohols, ethers, ketones, glycols, organic acids, and combinations thereof.

5. A system for chemical mechanical planarization of a semiconductor substrate having at least one surface comprising tungsten, the system comprising:
   a polishing pad;
   the CMP composition of claim 1;
   and an applicator operationally configured to apply the CMP composition to the polishing pad; and
   a carrier that is operationally configured to bring the at least one surface of comprising tungsten in contact with the polishing pad.

6. A method for chemical mechanical planarization (CMP) of a tungsten-containing surface of a semiconductor device, comprising the steps of:
   a) applying the CMP composition of claim 1 to a polishing pad;
   b) after performing step (a), polishing the tungsten-containing surface with the polishing pad produce a polished tungsten-containing surface.

7. The method of claim 6, further comprising:
   c) continuing to perform step (b) until the tungsten-containing surface comprises a dishing topography of less than 1000 Angstroms and an erosion topography of less than 1000 Angstroms.

* * * * *